United States Patent
Ceballos et al.

(10) Patent No.: US 8,633,843 B2
(45) Date of Patent: Jan. 21, 2014

(54) SYSTEM AND METHOD FOR CHOPPING OVERSAMPLED DATA CONVERTERS

(75) Inventors: Jose Luis Ceballos, Villach (AT); Christian Reindl, Villach (AT); Armin Albaner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/527,149

(22) Filed: Jun. 19, 2012

(65) Prior Publication Data

US 2013/0335247 A1 Dec. 19, 2013

(51) Int. Cl.
*H03M 3/00* (2006.01)

(52) U.S. Cl.
USPC .......................... 341/143; 341/155; 341/118

(58) Field of Classification Search
USPC .......................... 341/143, 155, 118
See application file for complete search history.

(56) References Cited

U.S. PATENT DOCUMENTS 5,675,334 A * 10/1997 McCartney .................... 341/118
7,538,705 B2 * 5/2009 Deval et al. .................... 341/143

* cited by examiner

*Primary Examiner* — Jean B Jeanglaude
(74) *Attorney, Agent, or Firm* — Slater & Matsil, L.L.P.

(57) ABSTRACT

In accordance with an embodiment, a circuit includes an analog chopping circuit having a first input coupled to a system input and a second input coupled to a first chopping signal, an oversampled data converter having an input coupled to an output of the analog chopping circuit, where the oversampled data converter is configured to produce an oversampled digital signal at an output of the oversampled data converter. The circuit further includes a digital filter having an input coupled to the output of the oversampled data converter, and a digital chopping circuit including a first input coupled to the output of the oversampled data converter, and a second input coupled to a second chopping signal. The digital filter is configured to filter quantization noise generated by the oversampled data converter.

21 Claims, 3 Drawing Sheets

US 8,633,843 B2

SYSTEM AND METHOD FOR CHOPPING OVERSAMPLED DATA CONVERTERS

TECHNICAL FIELD

This invention relates generally to semiconductor circuits and methods, and more particularly to a system and method for boosted switches.

BACKGROUND

Analog-to-digital converters are pervasively used in many applications ranging from DC and low frequency sensor applications, up to high frequency A/D converters used for wire-line and wireless communications. One commonly used A/D architecture is an oversampled A/D converter such as a sigma-delta modulator, which is generally a feedback loop that includes one or more integrators in a forward path followed by a low-resolution quantizer, the output of which is subtracted from the input to form an error signal. The quantizer output, which can have as low as one bit of resolution, is then decimated using a digital decimator to produce a multi-bit output.

One of the well-known properties of the sigma-delta modulator is that the quantization noise of the modulator is shaped by the loop filter. This noise shaping can yield a vast improvement in signal-to-noise ratio. For example, in a PCM A/D converter, each doubling in frequency yields a 3 dB improvement in the SNR. In a sigma-delta converter, however, each doubling in frequency ideally improves the SNR of the A/D converter by approximately, (6L+3) dB, where L is the order of the sigma-delta modulator. As such, sigma-delta modulators can provide SNRs of well over 100 dB for audio and low frequency applications.

One common way of implementing a sigma-delta A/D converter is by using a switched capacitor circuit. At its most basic level, switched capacitor circuits perform analog signal processing in the charge domain by sampling charge on capacitors. CMOS processes are particularly suited for such circuits. By using a combination of feedback amplifiers, switching devices and ratioed capacitors, various sampled analog transfer functions, including the integrator used for sigma-delta modulators may be accurately represented even in the presence of a high amount of absolute component value variation.

For very low frequency and quasi-DC applications, however, the DC offset of CMOS amplifiers, as well as the flicker noise present in CMOS devices pose some design challenges to very low frequency and quasi-DC applications.

SUMMARY OF THE INVENTION

In accordance with an embodiment, a circuit includes an analog chopping circuit comprising a first input coupled to a system input and a second input coupled to a first chopping signal, an oversampled data converter having an input coupled to an output of the analog chopping circuit, where the oversampled data converter is configured to produce an oversampled digital signal at an output of the oversampled data converter. The circuit further includes a digital filter having an input coupled to the output of the oversampled data converter, and a digital chopping circuit comprising a first input coupled to the output of the oversampled data converter, and a second input coupled to a second chopping signal. The digital filter is configured to filter quantization noise generated by the oversampled data converter.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a sigma-delta based A/D converter. Embodiments of the present invention are not limited to sigma-delta based A/D converters, and may also be applied to other types of data converters, as well as other types of circuits.

Figure 1:
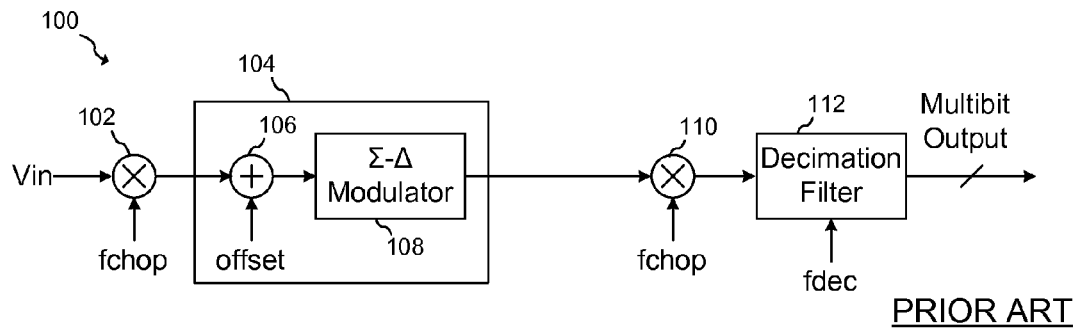
FIG. 1 illustrates a data converter according to the prior art.

FIG. 1 illustrates data converter system 100 according to the prior art, which includes analog chopping circuit 102, oversampling data converter 104, digital chopping block 110 and digital decimation filter 112. Oversampling data converter 104 is implemented, for example, by sigma-delta modulator 108. Summer 106 is included to model the effects of offset caused, for example, by mismatch present in the sigma-delta modulator. Chopping circuit 102 is used to upconvert input Vin to a higher frequency, for example fchop. When the output of oversampled data converter 104 is downconverted via digital chopping block 110, the signal of interest is downconverted back to baseband while offset from the sigma delta modulator is upconverted to frequency fchop. The upconverted offset component is then filtered out, along with the quantization noise of sigma-delta modulator 108, by decimation filter 112 to form a multi-bit output.

In conventional system 100 shown in FIG. 1, digital chopping block 110 may also downconvert quantization noise due to the interaction of the harmonics of frequency fchop with the thermal noise and quantization noise of oversampling data converter 104.

Figure 2:
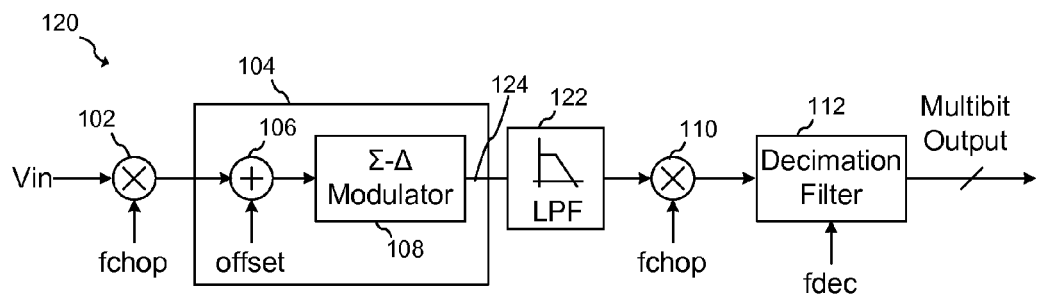
FIG. 2 illustrates a data converter according to an embodiment of the present invention.

FIG. 2 illustrates data converter system 120 according to an embodiment of the present invention. Data converter system 120 has chopping circuit 102 depicted as a mixer, oversampled data converter 104, digital filter 122, digital mixer 110, and decimation filter 112. In an embodiment, digital filter 122 filters out of band thermal noise and quantization noise prior to downcoversion by digital mixer 110, thereby preventing this out of band thermal noise and quantization noise from being downconverted to baseband by the harmonics of fchop.

In an embodiment, chopping circuit 102 may be implemented using techniques known in the art. For example, in one embodiment chopping circuit 102 may be implemented using a switching network that periodically inverts the polarity on the incoming signal. In one embodiment, data converter 104 operates at a sampling rate of 50 Ks/s and chopping circuit 102 inverts the polarity of the sampled signal at a rate of fchop=25 Hz. In alternative embodiments, chopping circuit 102 may be implemented using a switched capacitor amplifier, or other circuit types.

In an embodiment, sigma-delta modulator 108 is a $2^{nd}$ order modulator that processes the output of chopping circuit 102 at a sample rate of 50 Ks/s and produces digital output signal 124, which may be single bit stream or a multi-bit stream depending on the particular implementation and its specifications. In an embodiment, sigma-delta modulator 108 may be implemented using a switched capacitor circuit using design techniques known in the art. Alternatively, a continuous time modulator, or other modulator type may be used. While the depicted embodiment assumes that a baseband sigma-delta modulator is used, a bandpass modulator may be used in some embodiments. In yet further embodiments, a Nyquist rate A/D converter may be used in place of oversampled converter 104. In such an embodiment, decimation filter 112 may be omitted.

Digital filter 122 may be implemented using a lowpass digital filter structure such as an IIR filter, FIR filter, or other filter structure known in the art. In one embodiment, digital filter 122 is first or second order filter having a 3 dB point or cutoff frequency of about ten to twenty times the frequency of fchop. If chopping circuit 102 inverts the polarity of Vin using a square-wave function, most of the mixing harmonic energy will be present in the odd harmonics (i.e. 3*fchop, 5*fchop, 7*fchop, etc.) In some embodiments, the transfer function of digital filter 122 may include nulls in the frequency response that correspond to the harmonics of chopping frequency fchop. In alternative embodiments, other filter orders and/or cutoff frequencies may be used depending on the application and its specifications. Moreover, other filter responses besides lowpass may be used to implement digital filter 122 in alternative embodiments.

In an embodiment, digital mixer 110 may be implemented by a simple polarity inverter that inverts the polarity of the output of digital filter 122 at a rate of fchop. In some embodiments, the phase of the polarity inversion is adjusted to compensate for the phase delay of digital filter 122 at frequency fchop. In some cases, the phase delay of digital filter 122 may introduce a gain error due to phase mismatch. This phase delay compensation may be accomplished, for example, by advancing or delaying the polarity inversion by one or more ½-clock delays. For example, in one embodiment of the present invention the digital circuitry that implements digital mixer 110 operates using a system clock of about 20 MHz. In one embodiment of the present invention, the polarity inversion implemented by digital mixer 110 is delayed by one-half of a clock delay of the 20 MHz system clock. In alternative embodiments of the present invention, other system clock frequencies may be used in other means of adjusting the phase of digital mixer 110 may be implemented.

In some embodiments, phase compensation for the polarity inversion of digital mixer 110 may be omitted. For example, in one embodiment implementing digital filter 122 may result in a greater than 30 dB improvement in SNR when compared to an A/D converter topology that does not include digital filter 122. The gain error due to phase mismatch may be, for example, about 0.5 dB to about 1 dB, thereby resulting in a total SNR improvement of about 29 dB. If this 29 dB improvement in SNR results in a data converter that meets the specifications and requirements of the particular system, phase compensation may not be necessary.

In an embodiment, decimation filter 112 further filters the output of digital mixer 110 and produces a multi-bit output at frequency fdec. In one embodiment of the present invention, fdec is about 5 Hz. Alternatively, other frequencies for the multi-bit output of decimation filter 112 may be used. Decimation filter 112 may be implemented using techniques known in the art. For example, decimation filter 112 may be implemented using a comb filter followed by an FIR filter. In one particular embodiment, the multi-bit output of decimation filter 112 is 22 bits wide. Alternatively, other bit widths may be used depending on the application and its particular specifications.

In the embodiment shown in FIG. 2, data conversion system 120 may be used in very low frequency or in quasi-DC applications such as sensors and high accuracy battery voltage/current measurements circuits. In alternative embodiments of the present invention, embodiment techniques may be used to implement data converters for use in systems that have higher signal bandwidths, for example, audio converters.

In an embodiment, data converter system 120 may be implemented on a board level using board level components, on a single integrated circuit, or using a plurality of integrated circuits that are mounted to a circuit board and/or are housed in a single package such as a multichip module on a common substrate, for example. In some embodiments, the components of data converter 120 may be implemented using, for example, a CMOS process, or other semiconductor process type such as a bipolar process or a BiCMOS process. Digital filter 122, digital mixer 110, and decimation filter 112 may be implemented using custom logic, a programmable processor, and/or standard cell logic synthesized from HDL descriptions using synthesis techniques known in the art.

Figure 3:
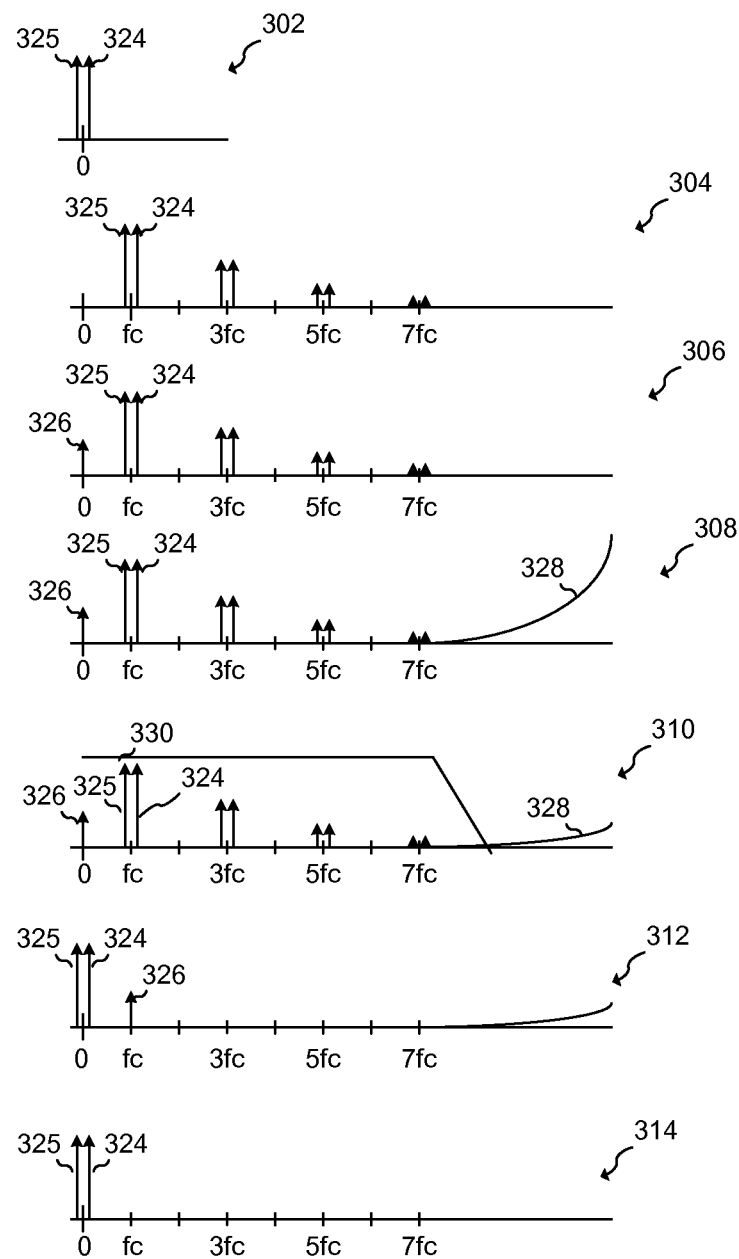
FIG. 3 illustrates frequency spectra of an embodiment data converter.

FIG. 3 illustrates a series of spectrum diagrams that corresponds to the spectra at various points of the signal path of data conversion system 120 shown in FIG. 2. Waveform diagram 302 illustrates the spectrum of signal Vin, assuming a single low-frequency tone 324. The negative frequency component of tone 324 is also illustrated in waveform diagram 302 as tone 325. Waveform diagram 304 depicts the spectrum at the output of chopping circuit 102 assuming that Vin is being modulated with a square wave. Here, the low frequency input tone has been upconverted to upper sideband tone 324 and lower sideband tone 325 situated near chopping frequency fc. In addition, harmonics are generated in the vicinity of odd harmonic frequencies 3fc, 5fc, 7 fc, etc. Waveform diagram 306 illustrates the frequency spectrum at the output of summing block 106 that models the effect of offset caused, for example, by device mismatch in the first stages of sigma-delta modulator 108. This offset is shown as tone 326 at zero frequency.

Waveform diagram 308 illustrates the spectrum of the output of sigma-delta modulator 108. Here, upper sideband 324, lower sideband 325, DC offset 326, and the mixing products generated by the chopping amplifier are still apparent. In addition, quantization noise 328 is present in the output spectrum of sigma-delta modulator 108. Waveform diagram 310 illustrates the frequency spectrum at the output of digital filter 122, which implements digital filter transfer function 330. Digital filter 122 reduces the amplitude of quantization noise 328. Waveform diagram 312 illustrates the output spectrum of digital mixer 110. Here, it can be seen that DC offset 326 has been upconverted to chopping frequency FC, and the upconverted input signal has been down converted back to frequency offsets about zero frequency.

Waveform diagram 314 illustrates the output spectrum of decimation filter 112. Here, it can be seen that DC offset component 326 is filtered out leaving positive frequency input tone 324 and negative frequency input tone 325.

It should be appreciated that the spectral diagrams illustrated in FIG. 3 illustrates just one example of one embodiment implementation. In alternative embodiments, the resulting spectral performance may be different. For example, chopping circuit 102 may generate even harmonics in addition to the odd harmonics depicted in FIG. 3. Furthermore, the choice of using a single input tone for the example of FIG. 3 is done for the purposes of illustration. During normal operation of data conversion system 120 non-sinusoidal inputs, of course, may be processed by the data converter.

Figure 4:
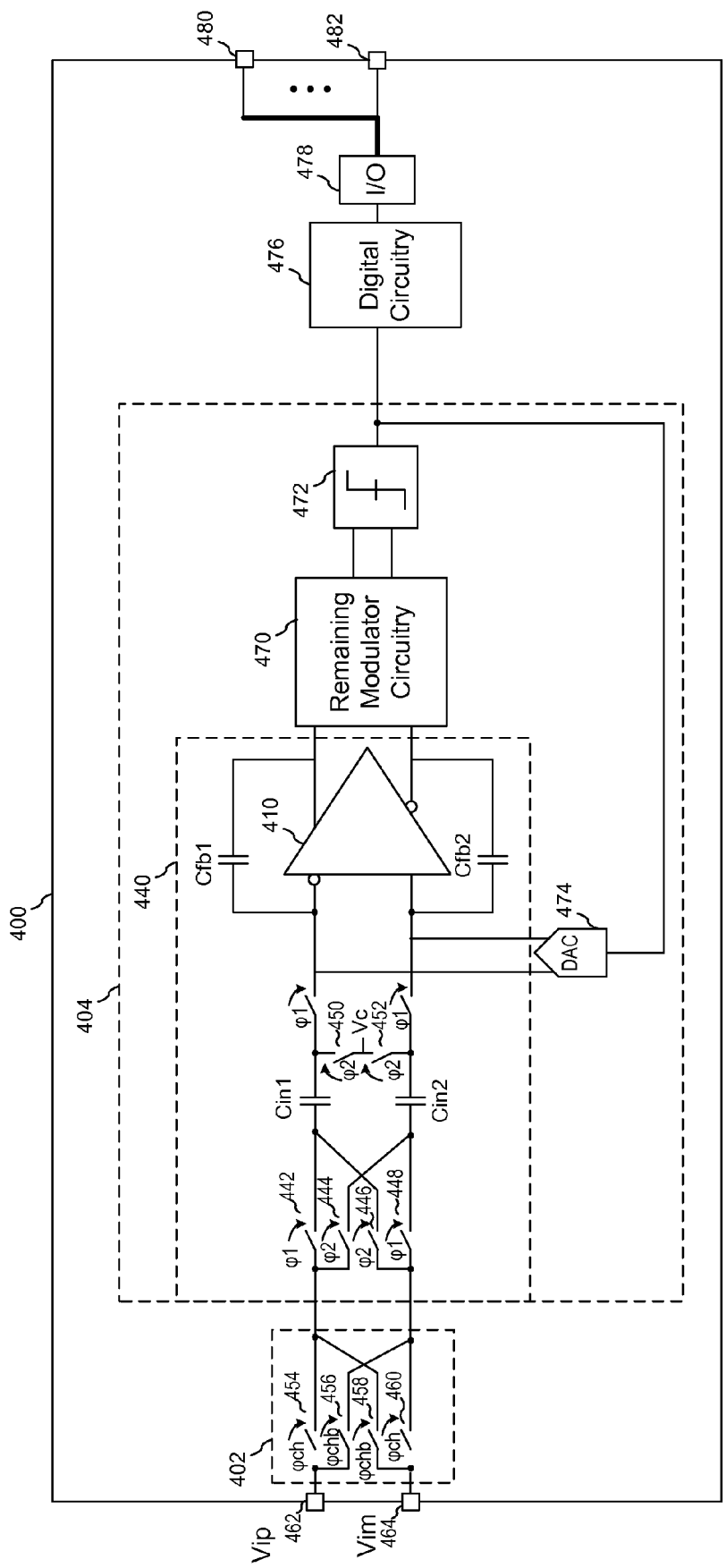
FIG. 4 illustrates an embodiment integrated circuit.

FIG. 4 illustrates a data converter IC 400 according an embodiment of the present invention. Data converter IC 400 has input chopping circuit 402 coupled to input pads 462 and 464, sigma-delta modulator 404, digital circuitry 476, and I/O circuitry 478 coupled to output pads 480 and 482. In an embodiment, chopping circuit 402 is implemented using switches 454, 456, 458 and 460. Switches 454 and 460 form a non-inverting signal path controlled by phase φch, and switches 456 and 458 form an inverting signal path controlled by phase φchb, which is the opposite polarity of φch. Sigma-delta modulator 404 contains first stage integrator 440, remaining modulator circuitry 470, quantizer 472, and DAC 474. In an embodiment, first stage integrator 440 has input switches 442, 448, 451 and 452 that are activated when phase φ1 is active, and input switches 444, 446, 450 and 452 that are activated when phase φ2 is active. Phases φ1 and φ2 are non-overlapping phases. During phase φ1, switches 442, 448, 451 and 453 couple capacitors Cin1 and Cin2 to the input of the modulator and to the inputs of amplifier 410 in a non-inverting fashion. During φ2, switches 444, 446, 450 and 452 couple capacitors Cin1 and Cin2 to the input of the modulator and to common-mode voltage Vc in an inverting fashion.

In some embodiments, switches 454, 456, 458 and 460 of chopping circuit 402 may be combined with switches 442, 444, 446 and 448 of integrator 440 by using a single set of switches and driving the switches with logically ORed clock phases. For example, in one embodiment, chopping block 402 may be eliminated and switches 442 and 448 may be driven by ((φ1 OR φch), and switches 444 and 446 may be driven by ((φ2 OR φchb).

Remaining modulator circuitry 470 may include, for example, additional integrator stages and/or other modulator circuitry that supports the operation of sigma-delta modulator 404. Quantizer 472 may be a single-bit comparator or a multi-bit comparator depending on the particular application and its specifications. DAC 474 is configured to provide feedback based on the output of quantizer 472 using, for example, a further switched capacitor stage. In some embodiments, the elements in modulator 404 may be implemented using design techniques and circuitry known in the art.

In an embodiment, digital circuitry 476 may be used to implement digital lowpass filter 122, digital chopping circuit 110 and decimation filter 112 shown in FIG. 2 to provide an n-bit signal to I/O block 478, which drives output pads 480 and 482. In one embodiment, the output of digital circuitry is an n-bit output, and I/O block 478 may be configured to drive n output pads. Alternatively, I/O block 478 may be configured to output a single output data line if a serial interface is used. In an embodiment, data converter IC 400 may be implemented on a signal integrated circuit using, for example a CMOS process. In further embodiments, the circuitry of data converter IC 400 may be divided among multiple integrated circuits and/or board level circuitry. Data converter IC 400 may also be implemented using other semiconductor fabrication technologies.

In accordance with an embodiment, a circuit includes an analog chopping circuit having a first input coupled to a system input and a second input coupled to a first chopping signal. The circuit also has an oversampled data converter having an input coupled to an output of the analog chopping circuit, such that the oversampled data converter is configured to produce an oversampled digital signal at an output of the oversampled data converter. Further included in the circuit is a digital filter having an input coupled to the output of the oversampled data converter, a digital chopping circuit comprising a first input coupled to the output of the oversampled data converter, and a second input coupled to a second chopping signal. The digital filter is configured to filter quantization noise generated by the oversampled data converter, and may be implemented as a lowpass filter in some embodiments.

In some embodiments, the oversampled data converter may be implemented as a sigma-delta modulator that produces a single-bit output or a multi-bit output. The circuit may further include a decimation filter coupled to an output of the digital chopping circuit. This decimation filter may be configured to produce a multi-bit output. In an embodiment, the circuit may be disposed on a semiconductor substrate.

In an embodiment, the first chopping signal and the second chopping signal comprise a same frequency. In some cases, the phase of the second chopping signal may be delayed with respect to the first chopping signal by a first phase delay. Here, the first phase delay may compensate for a phase delay of the digital filter.

In accordance with a further embodiment, an analog-to-digital (A/D) converter includes a first chopping circuit coupled to an input of the A/D, a sigma-delta modulator having an input coupled to an output of the chopping circuit, a digital filter coupled to an output of the sigma-delta modulator, a digital polarity inverter coupled to an output of the digital filter, and a decimation filter coupled to an output of the digital polarity inverter. The first chopping circuit is configured to invert a polarity of the input of the A/D at a first frequency, the digital filter is configured to filter mixing products of the first chopping circuit and quantization noise generated by the sigma-delta modulator. The digital polarity inverter is configured to invert a polarity of the digital filter output at the first frequency, and the decimation filter is configured to produce a multi-bit output of the A/D converter at an output sample frequency. In some embodiments, the digital filter is implemented as a lowpass filter.

In an embodiment, the first frequency is greater than the output sample frequency. Furthermore, the A/D converter may be a quasi-DC converter and/or the A/D converter may be disposed on a semiconductor substrate.

In accordance with a further embodiment, a method of performing an A/D conversion includes upconverting an input of the A/D by a first frequency to form an upconverted analog input, generating an oversampled digital output from the upconverted analog input, filtering mixing products generated by the upconverting from the oversampled digital output to form a filtered oversampled digital signal, downconverting the filtered oversampled digital signal by the first frequency to form a downconverted filtered oversampled digital signal, and decimating the downconverted filtered oversampled digital signal to form a multi-bit output.

In an embodiment, upconverting includes multiplying the input of the A/D by a square wave of the first frequency at a first phase. Downconverting the filtered oversampled digital signal includes changing a polarity of the filtered oversampled digital signal at the first frequency at a second phase. In some embodiments, the method also includes comprising delaying the second phase with respect to the first phase, for example, to compensate for a phase delay caused by filtering the mixing products.

In an embodiment, filtering the mixing products includes applying a lowpass filter function in the digital domain. Furthermore, generating the oversampled digital output from the upconverted analog input may include a sigma-delta modulator.

Advantages of embodiment systems and methods include the ability to implement a very high-resolution quasi-DC converter that is insensitive to component offset, flicker noise and thermal noise. Accordingly, smaller device sizes, lower currents, and smaller capacitors may be used when implementing embodiment circuits.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
   an analog chopping circuit comprising a first input coupled to a system input and a second input coupled to a first chopping signal;
   an oversampled data converter having an input coupled to an output of the analog chopping circuit, the oversampled data converter configured to produce an oversampled digital signal at an output of the oversampled data converter;
   a digital filter comprising an input coupled to the output of the oversampled data converter, the digital filter configured to filter quantization noise generated by the oversampled data converter; and
   a digital chopping circuit comprising a first input coupled to the output of the digital filter, and a second input coupled to a second chopping signal.

2. The circuit of claim 1, further comprising a decimation filter coupled to an output of the digital chopping circuit, the decimation filter configured to produce a multi-bit output.

3. The circuit of claim 1, wherein the first chopping signal and the second chopping signal comprise a same frequency.

4. The circuit of claim 3, wherein a phase of the second chopping signal is delayed with respect to the first chopping signal by a first phase delay.

5. The circuit of claim 4, wherein the first phase delay compensates for a phase delay of the digital filter.

6. The circuit of claim 1, wherein the digital filter comprises a digital lowpass filter.

7. The circuit of claim 1, wherein the oversampled data converter comprises a sigma-delta modulator.

8. The circuit of claim 7, wherein the sigma-delta modulator is configured to produce a single-bit output.

9. The circuit of claim 7, wherein the sigma-delta modulator is configured to produce a multi-bit output.

10. The circuit of claim 1, wherein the circuit is disposed on a semiconductor substrate.

11. An analog-to-digital (A/D) converter comprising:
    a first chopping circuit coupled to an input of the A/D converter, the first chopping circuit configured to invert a polarity of the input of the A/D converter at a first frequency;
    a sigma-delta modulator having an input coupled to an output of the chopping circuit;
    a digital filter coupled to an output of the sigma-delta modulator, the digital filter configured to filter mixing products of the first chopping circuit and quantization noise generated by the sigma-delta modulator;
    a digital polarity inverter configured to invert a polarity of the digital filter output at the first frequency; and
    a decimation filter coupled to an output of the digital polarity inverter, the decimation filter configured to produce a multi-bit output of the A/D converter at an output sample frequency.

12. The A/D converter of claim 11, wherein the digital filter comprises a lowpass filter.

13. The A/D converter of claim 11, wherein the first frequency is greater than the output sample frequency.

14. The A/D converter of claim 11, wherein the A/D converter is a quasi-DC converter.

15. The A/D converter of claim 11, wherein the A/D converter is disposed on a semiconductor substrate.

16. A method of performing an A/D conversion, the method comprising:
    upconverting an input of the A/D by a first frequency to form an upconverted analog input;
    generating an oversampled digital output from the upconverted analog input;
    filtering mixing products generated by the upconverting from the oversampled digital output to form a filtered oversampled digital signal;
    downconverting the filtered oversampled digital signal by the first frequency to form a downconverted filtered oversampled digital signal; and
    decimating the downconverted filtered oversampled digital signal to form a multi-bit output.

17. The method of claim 16, wherein:
    upconverting comprises multiplying the input of the A/D by a square wave of the first frequency at a first phase; and
    downconverting the filtered oversampled digital signal comprises changing a polarity of the filtered oversampled digital signal at the first frequency at a second phase.

18. The method of claim 17, further comprising delaying the second phase with respect to the first phase.

19. The method of claim 18, wherein delaying the second phase with respect to the first phase comprises delaying the second phase to compensate for a phase delay caused by filtering the mixing products.

20. The method of claim 16, wherein filtering the mixing products comprises applying a lowpass filter function in a digital domain.

21. The method of claim 16, wherein generating the oversampled digital output from the upconverted analog input comprises using a sigma-delta modulator.

* * * * *